(12) United States Patent
Liu et al.

(10) Patent No.: US 9,142,673 B2
(45) Date of Patent: Sep. 22, 2015

(54) DEVICES AND METHODS OF FORMING BULK FINFETS WITH LATERAL SEG FOR SOURCE AND DRAIN ON DIELECTRICS

(71) Applicant: GLOBAL FOUNDRIES Inc., Grand Cayman (KY)

(72) Inventors: Jin Ping Liu, Ballston Lake, NY (US); Min-hwa Chi, Malta, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 13/955,861

(22) Filed: Jul. 31, 2013

(65) Prior Publication Data

US 2015/0035018 A1 Feb. 5, 2015

(51) Int. Cl.
*H01L 21/336* (2006.01)
*H01L 29/78* (2006.01)
*H01L 29/66* (2006.01)

(52) U.S. Cl.
CPC ........ *H01L 29/785* (2013.01); *H01L 29/66795* (2013.01)

(58) Field of Classification Search
CPC ............... H01L 24/823418–21/823431; H01L 21/823814–21/823821; H01L 21/845; H01L 27/0886–27/0924; H01L 27/10826; H01L 27/10879; H01L 27/1211; H01L 29/41791; H01L 29/66772; H01L 29/66795; H01L 28/7831; H01L 2029/7857–29/7858; H01L 2924/13067
See application file for complete search history.

(56) References Cited

U.S. PATENT DOCUMENTS

| | | | | |
|---|---|---|---|---|
| 6,165,826 A | * | 12/2000 | Chau et al. | 438/231 |
| 6,346,729 B1 | * | 2/2002 | Liang et al. | 257/344 |
| 2009/0045411 A1 | * | 2/2009 | Lin et al. | 257/77 |
| 2011/0272739 A1 | * | 11/2011 | Lee et al. | 257/192 |

* cited by examiner

*Primary Examiner* — David Vu
*Assistant Examiner* — Cuong Nguyen
(74) *Attorney, Agent, or Firm* — Heslin Rothenberg Farley & Mesiti P.C.

(57) ABSTRACT

Devices and methods for forming semiconductor devices with FinFETs are provided. One intermediate semiconductor device includes, for instance: a substrate with at least one fin with at least one channel; at least one gate over the channel; at least one hard-mask over the gate; and at least one spacer disposed over the gate and hard-mask. One method includes, for instance: obtaining an intermediate semiconductor device; forming at least one recess into the substrate, the recess including a bottom and at least one sidewall exposing a portion of the at least one fin; depositing a dielectric layer into the at least one recess; removing at least a portion of the dielectric layer to form a barrier dielectric layer; and performing selective epitaxial growth in the at least one recess over the barrier dielectric layer.

6 Claims, 17 Drawing Sheets

DEVICES AND METHODS OF FORMING BULK FINFETS WITH LATERAL SEG FOR SOURCE AND DRAIN ON DIELECTRICS

FIELD OF THE INVENTION

The present invention relates to semiconductor devices and methods of fabricating semiconductor devices, and more particularly, to bulk FinFETs and methods of fabricating semiconductor devices having bulk FinFETs with lateral epitaxial growth for the source and drain on dielectrics.

BACKGROUND OF THE INVENTION

Currently produced complementary-metal-oxide-semiconductor (CMOS) devices, e.g., 20 nm and above, include FinFETs which are generally formed on silicon on insulator (SOI) or bulk substrates. A SOI FinFET may provide better isolation between the source and drain, as well as less junction leakage. The smaller parasite capacitance of the SOI FinFET also provides stronger AC performance and there is no need for shallow trench isolation (STI). However, a SOI substrate is more expensive than a bulk substrate. Alternatively a bulk FinFET has stronger strain engineering for enhancement of channel mobility and is better compatible with planar CMOS process flow. Although bulk FinFETs need halo implants for isolation between source and drain regions. In addition, bulk FinFET devices experience more junction leakage and gate-induced drain leakage (GIDL) than SOI substrates. Bulk substrates also have larger parasite junction capacitance which degrades AC performance.

Thus, the fabrication of FinFET devices can be problematic with existing substrates and designs and improved substrates and FinFET device designs are needed for forming FinFET devices to improve the electrical performance of the resultant semiconductor devices.

BRIEF SUMMARY

The shortcomings of the prior art are overcome and additional advantages are provided through the provision, in one aspect, an intermediate semiconductor device which includes, for instance: a substrate with at least one fin with at least one channel; at least one gate over the at least one channel; at least one hard-mask over the at least one gate; and at least one spacer disposed over the at least one gate and the at least one hard-mask.

In another aspect, a method includes, for instance: obtaining an intermediate semiconductor device; forming at least one recess into the substrate, the recess including a bottom and at least one sidewall exposing a portion of the at least one fin; depositing a dielectric layer into the at least one recess; removing at least a portion of the dielectric layer to form a barrier dielectric layer; and performing selective epitaxial growth in the at least one recess over the barrier dielectric layer.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION

Aspects of the present invention and certain features, advantages, and details thereof, are explained more fully below with reference to the non-limiting embodiments illustrated in the accompanying drawings. Descriptions of well-known materials, fabrication tools, processing techniques, etc., are omitted so as to not unnecessarily obscure the invention in detail. It should be understood, however, that the detailed description and the specific examples, while indicating embodiments of the invention, are given by way of illustration only, and are not by way of limitation. Various substitutions, modifications, additions and/or arrangements within the spirit and/or scope of the underlying inventive concepts will be apparent to those skilled in the art from this disclosure. Note also that reference is made below to the drawings, which are not drawn to scale for ease of understanding, wherein the same reference numbers used throughout different figures designate the same or similar components.

Generally stated, disclosed herein are certain novel FinFET device formation methods and FinFET structures, which provide advantages over the above noted, existing FinFET device fabrication processes and structures. Advantageously, the FinFET device fabrication processes disclosed herein provide for a FinFET with the source and drain on local SOI and the channel on bulk.

Figure 1:
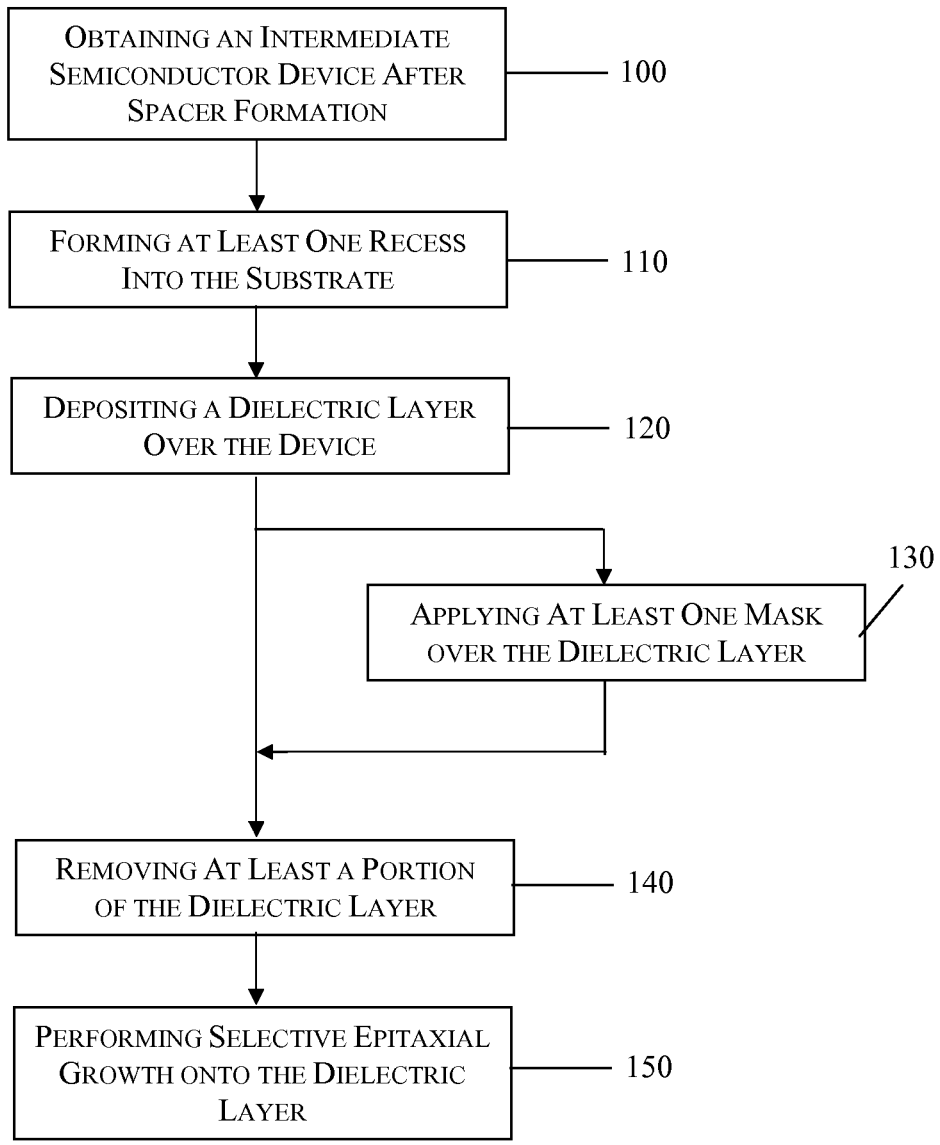
FIG. 1 depicts one embodiment of a process for fabricating, for instance, bulk FinFETs with lateral selective epitaxial grown source and drain on dielectrics, in accordance with one or more aspects of the present invention.

In one aspect, in one embodiment, as shown in FIG. 1, FinFET device formation in accordance with one or more aspects of the present invention may include, for instance: obtaining an intermediate semiconductor device 100; forming at least one recess into the substrate, wherein the recess includes a bottom and at least one sidewall exposing a portion of the at least one fin 110; depositing a dielectric layer into the at least one recess 120; removing at least a portion of the dielectric layer to form a barrier dielectric layer 140; and performing selective epitaxial growth in the at least one recess over the barrier dielectric layer 150. The FinFET formation may also include: applying at least one mask over the dielectric layer 130.

Figure 2:
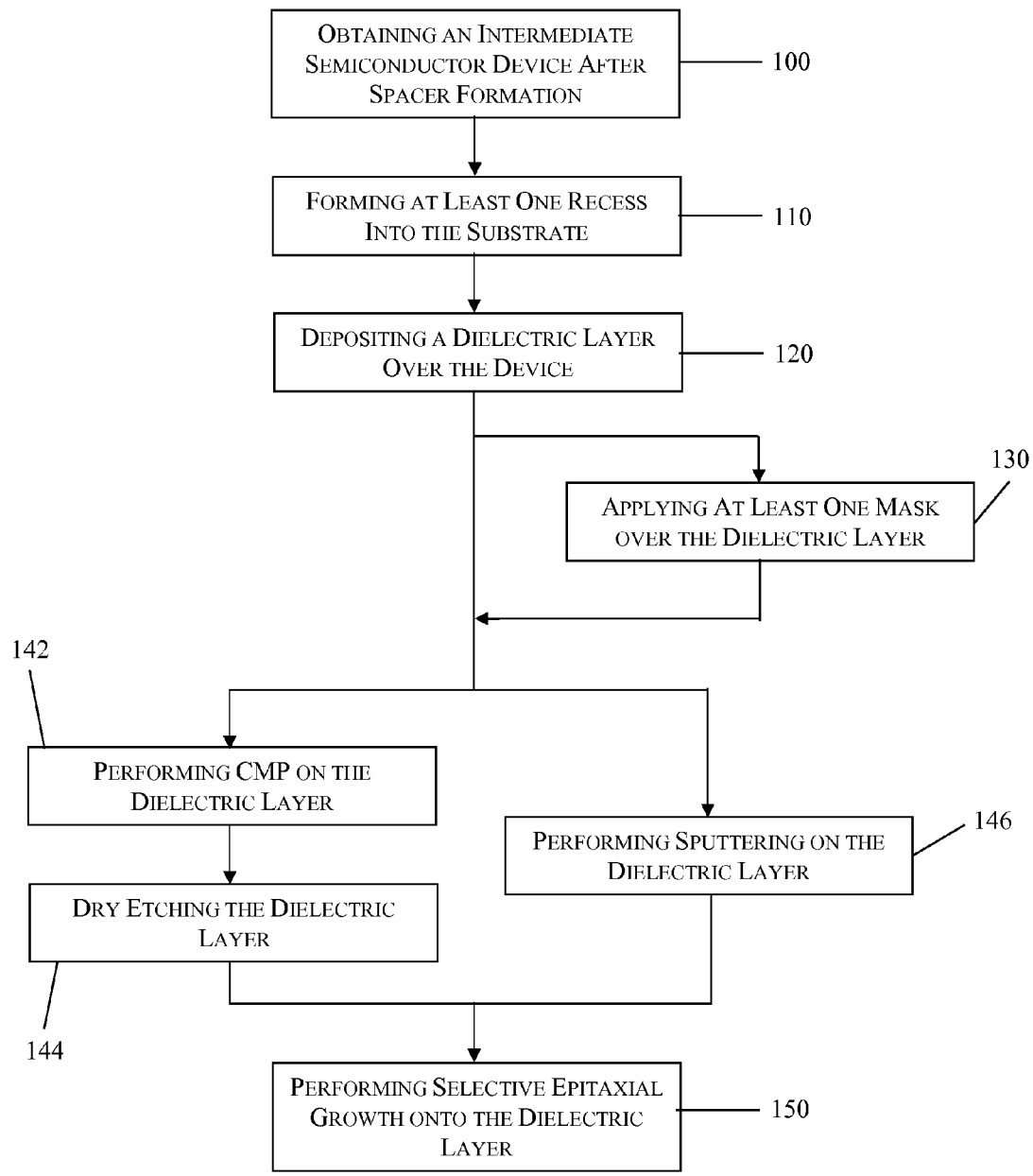
FIG. 2 depicts another embodiment of a process for fabricating, for instance, bulk FinFETs with lateral selective epitaxial grown source and drain on dielectrics, in accordance with one or more aspects of the present invention.

As shown in FIG. 1, this process is inherent in the more detailed FinFET structure formation process approach of FIG. 2. The removing at least a portion of the dielectric layer to expose a sidewall of the fin 140, of FIG. 1, in one aspect disclosed herein may include: performing chemical mechanical planarization on the dielectric layer 142; and dry etching the dielectric layer to expose at least a portion of the fin's sidewall 144.

Also shown in FIG. 2, the removing at least a portion of the dielectric layer to expose a sidewall of the fin 140, of FIG. 1, in another aspect disclosed herein may include: performing sputtering on the dielectric layer to expose at least a portion of the sidewall of the fin 146.

FIGS. 3-8 depict, by way of example only, one detailed embodiment of a FinFET device formation process, and the resultant FinFET structure, in accordance with one or more aspects of the present invention. Note again that these figures are not drawn to scale in order to facilitate understanding of the invention, and that the same reference numerals used throughout different figures designate the same or similar elements.

Figure 3:
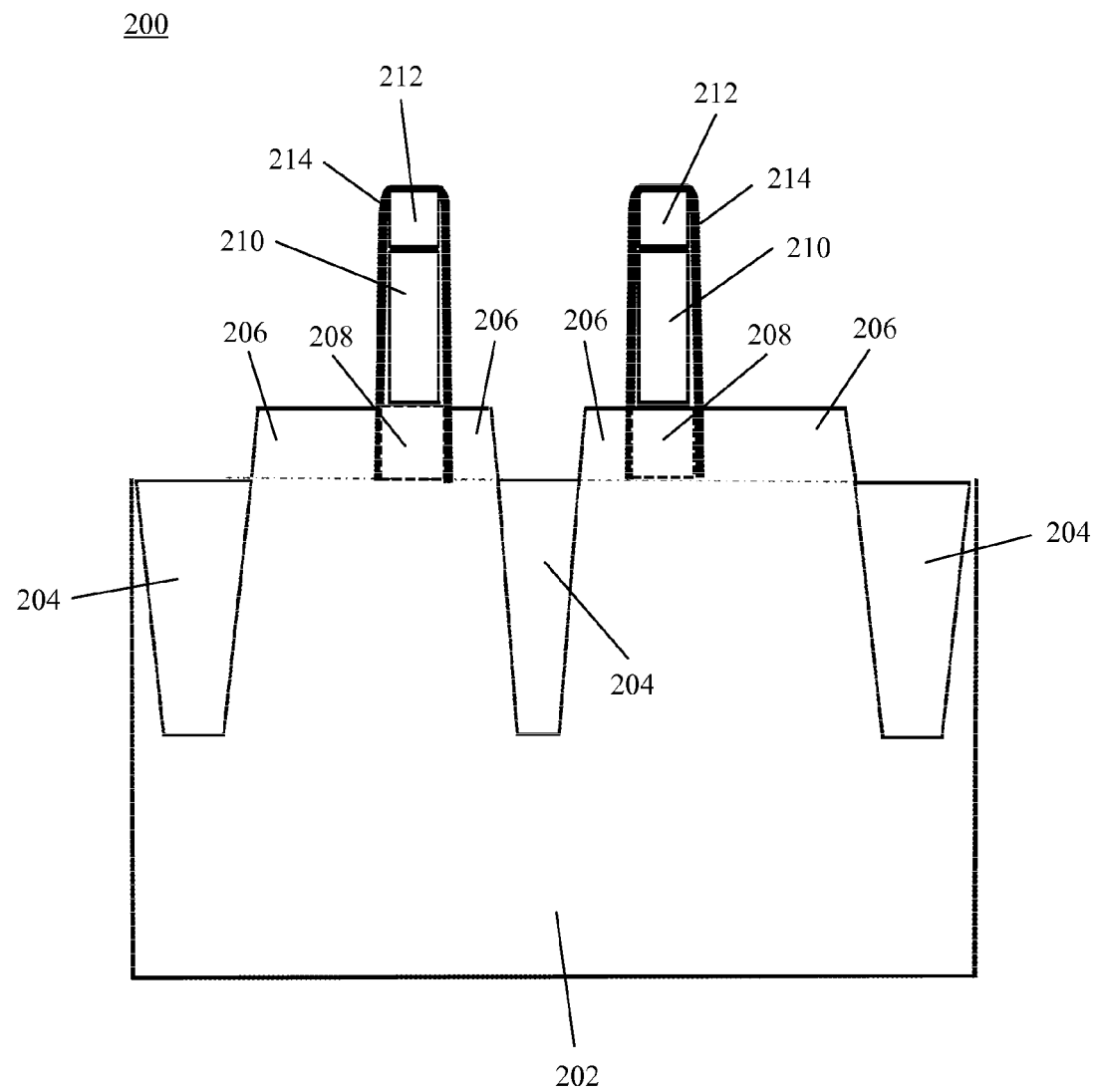
FIG. 3 depicts one embodiment of an intermediate structure of a semiconductor device with at least one exposed fin, in accordance with one or more aspects of the present invention.

An intermediate semiconductor device structure 200 is schematically illustrated in FIGS. 3-8 at several intermediate stages of manufacturing. The semiconductor device structure 200, as shown in FIG. 3, may have been processed through, for example, shallow trench isolation (STI) and fin formation, n/p well formation, and gate stack formation. As depicted in FIG. 3, the intermediate structure 200 may include a substrate 202 which may be made of, for example, a semiconductor material. The semiconductor material may include, e.g., silicon, germanium, a compound semiconductor material, a layered semiconductor material, a silicon-on-insulator (SOI) material, a SiGe-on-insulator (SGOI) material, a germanium-on-insulator (GOI) material, and/or the like. The intermediate structure 200 may also include at least one shallow trench isolation (STI) region 204. The intermediate structure 200 may further include at least one exposed fin 206 with at least one channel region 208 in the at least one exposed fin 206. At least one gate 210 may be formed over the at least one channel region 208 and a hard mask region 212 may be applied on top of the at least one gate 210. The at least one gate 210 and the hard mask region 212 together may form a poly gate structure 210, 212. In addition, the intermediate structure 200 may include at least one spacer 214 applied over the poly gate structure 210, 212. As shown in the depicted embodiment, the device 200 of FIG. 3 includes three STI regions 204 in the substrate 202, with one STI region 204 placed between the two poly gate structures 210, 212.

Figure 4:
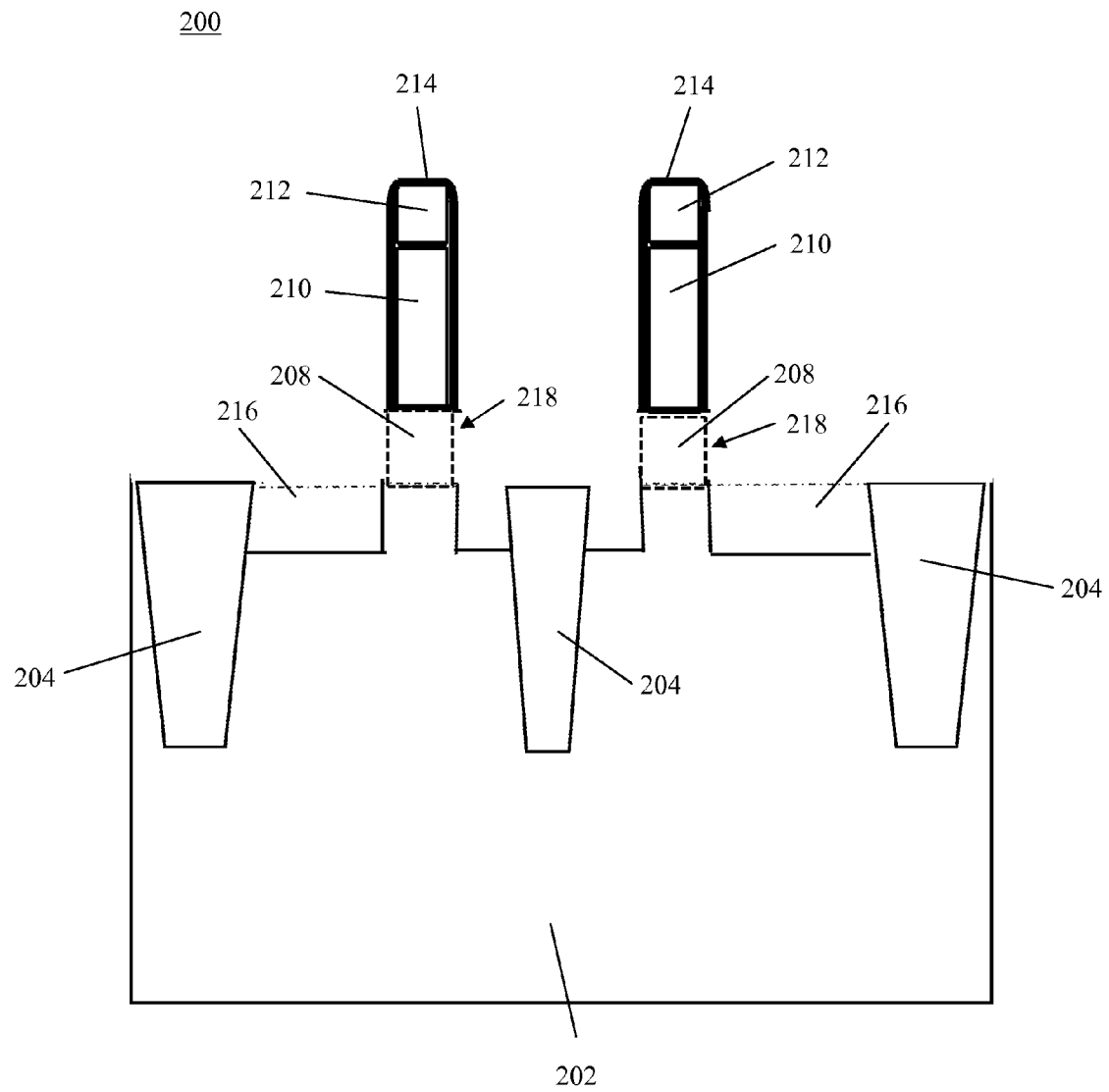
FIG. 4 depicts the intermediate structure of FIG. 3 after creating recesses for the sources and drains, in accordance with one or more aspects of the present invention.

As shown in FIG. 4, at least one recess 216 is etched into the substrate 202. The at least one recess 216 may be used for forming the source and drain of the structure 200. The at least one recess 216 is formed below the active fins 206, below the top surface level of the at least one STI region 204, and into the base of the fins 206 by, for example, approximately 5 nm to 200 nm, and more preferably approximately 70 nm to 150 nm. The depth of the at least one recess 216 may be uniform across the different device structures. When the recesses 216 are created, the fin sidewalls 218 are exposed below the active portion of the fins 206. Thus, the extension and/or halo implants that are currently used may be eliminated.

Figure 5:
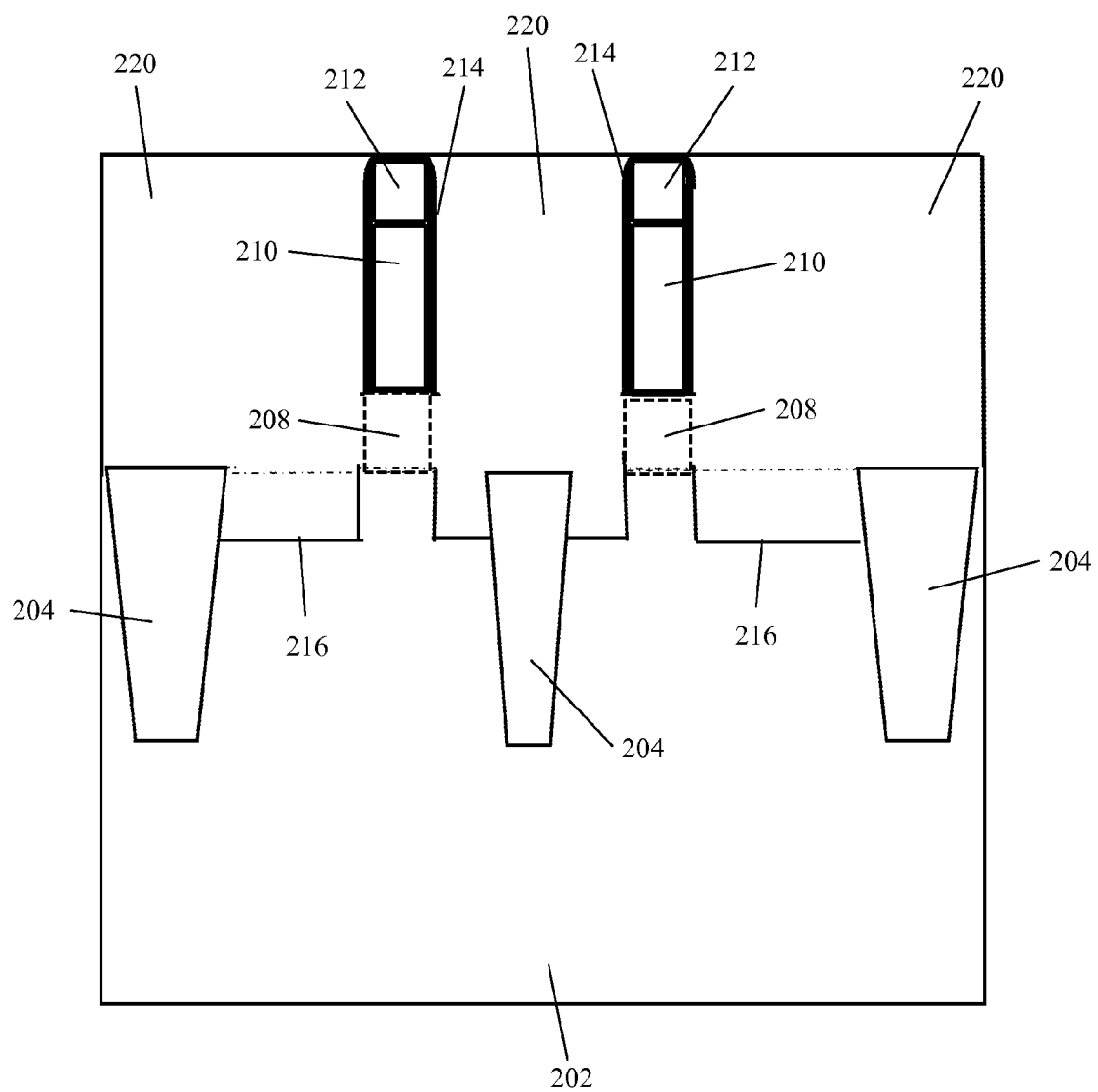
FIG. 5 depicts the intermediate structure of FIG. 4 after application of a dielectric layer, in accordance with one or more aspects of the present invention.

Next a thick dielectric layer 220 may be deposited over the intermediate structure of FIG. 4, as shown in FIG. 5. The thickness of the dielectric layer 220 shall correspond to the highest point on the device 200, for example, the dielectric layer 220 should be thick enough to cover the poly gate structures 210, 212. The thick dielectric layer 220 may be, for example, $SiO_2$ or another lower K dielectric material. After the dielectric layer 220 is deposited, chemical-mechanical planarization may be performed. The chemical-mechanical planarization may stop on a hard-mask, which may be, for example, $Si_3N_4$.

Figure 6:
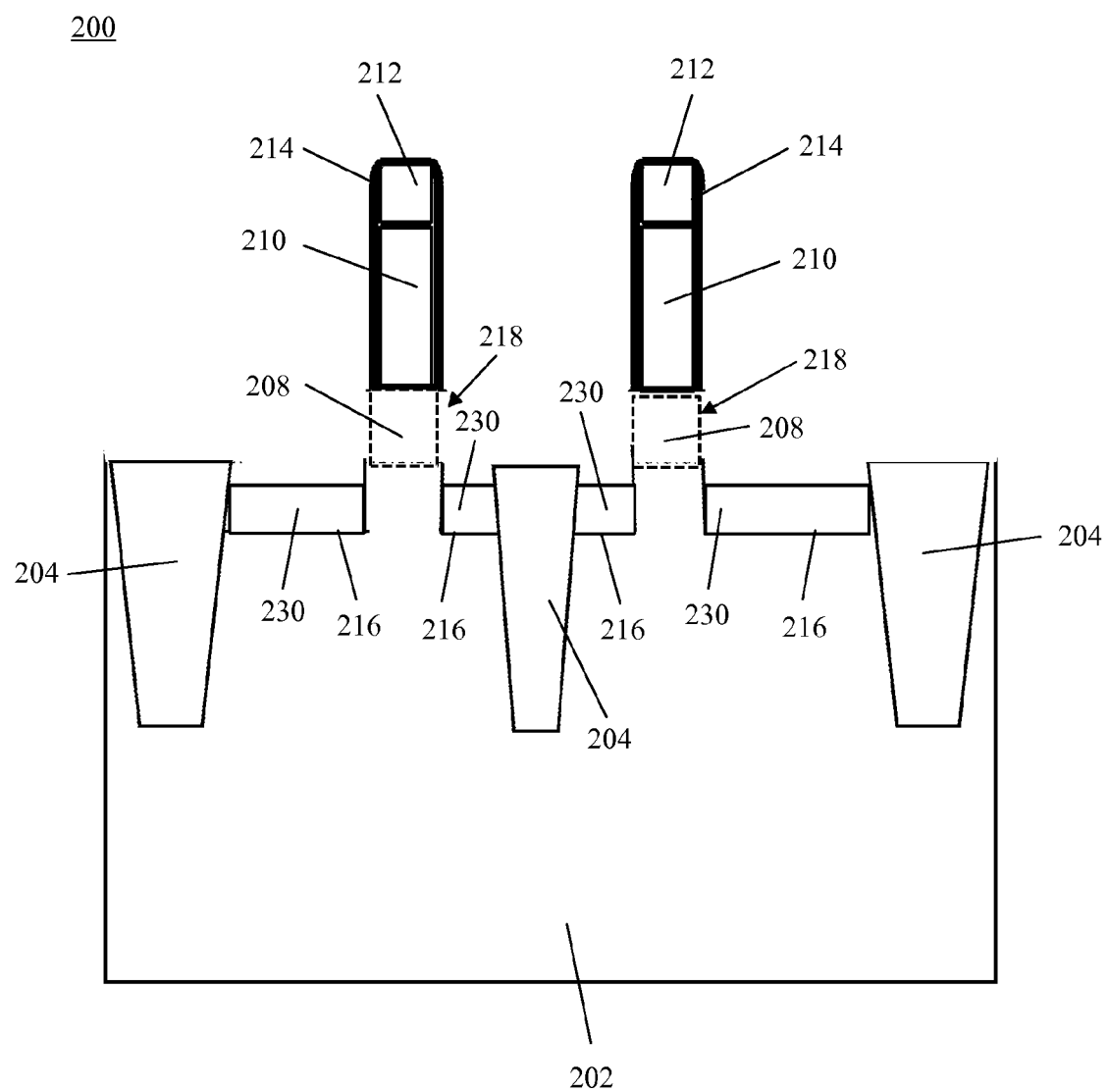
FIG. 6 depicts the intermediate structure of FIG. 5 after dry etching the dielectric layer to expose at least one sidewall of the fin, in accordance with one or more aspects of the present invention.
Figure 7:
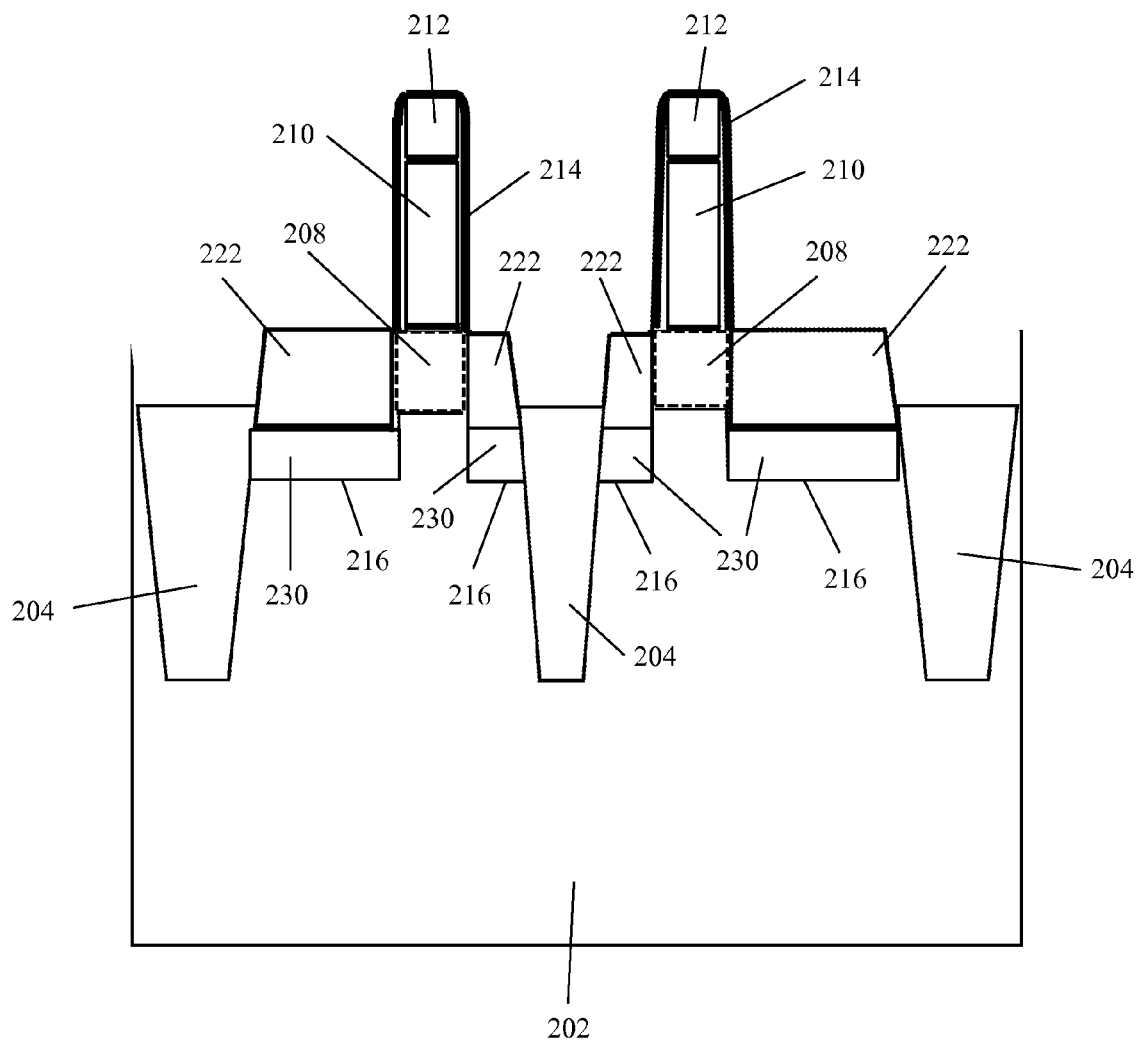
FIG. 7 depicts the intermediate structure of FIG. 6 after application of an epitaxial layer, in accordance with one or more aspects of the present invention.

A dry etch may then be performed to expose the fin sidewalls 218 to a position slightly below the active fins 206. As shown in FIG. 6, a single dry etch may be performed on the dielectric layer 220. The single dry etch may be used when the same material is being used for both the n-type field effect transistors (nFET) and the p-type field effect transistors (pFET). After the nFET and pFET areas are exposed, a barrier dielectric layer 230 may remain in the recesses 216 with the top portion of the barrier dielectric layer 230 positioned slightly below the active portion of the fins 206, as shown in FIG. 6. Then selective epitaxial growth (SEG) may be performed over the barrier dielectric layer 230 forming an epi layer 222, as shown in FIG. 7. By way of specific example, Si epitaxial growth may be grown laterally over the source and drain areas.

Figure 8:
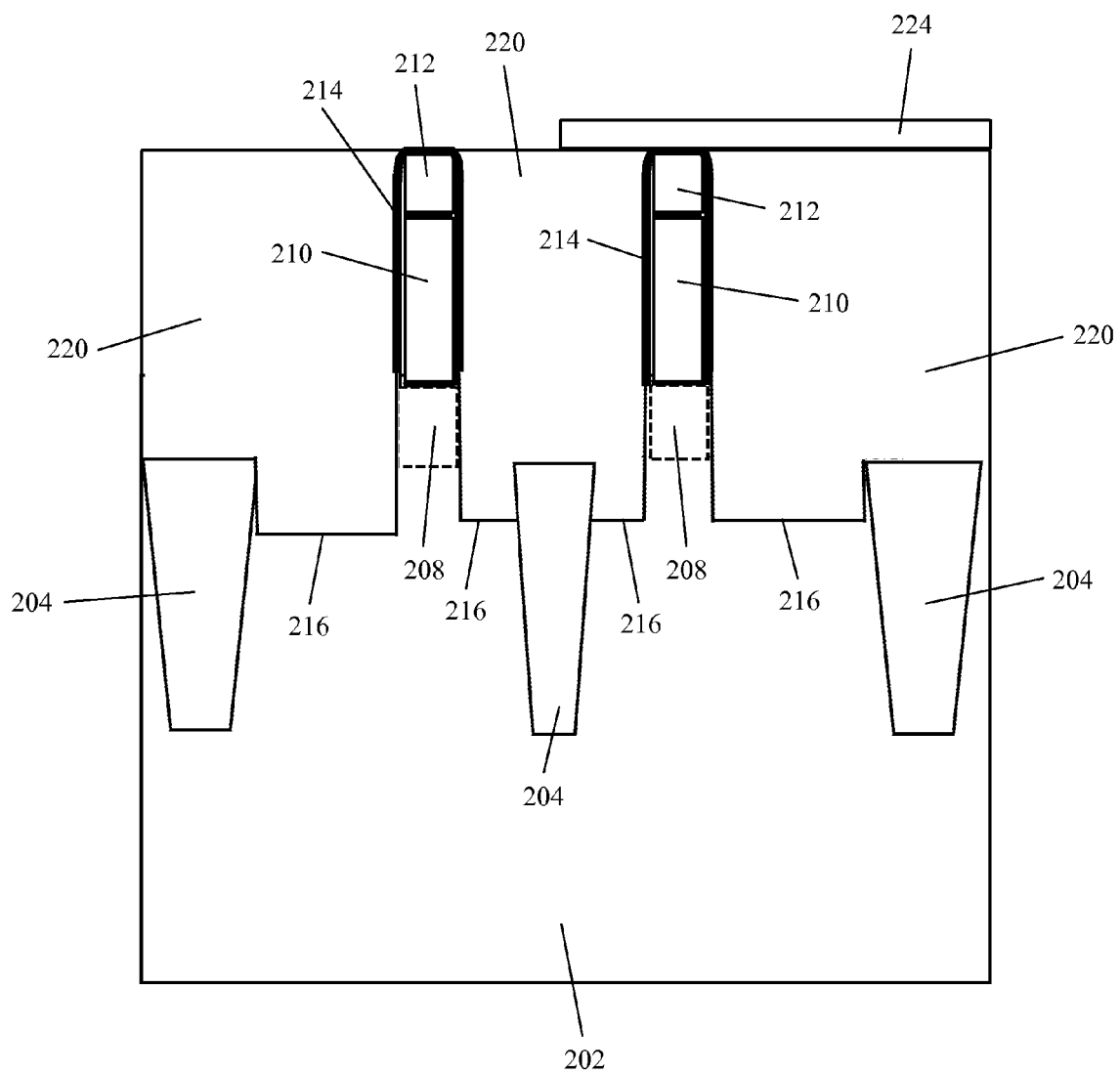
FIG. 8 depicts the intermediate structure of FIG. 5 with a hard mask applied over a portion of the dielectric layer of the intermediate structure, in accordance with one or more aspects of the present invention.
Figure 9:
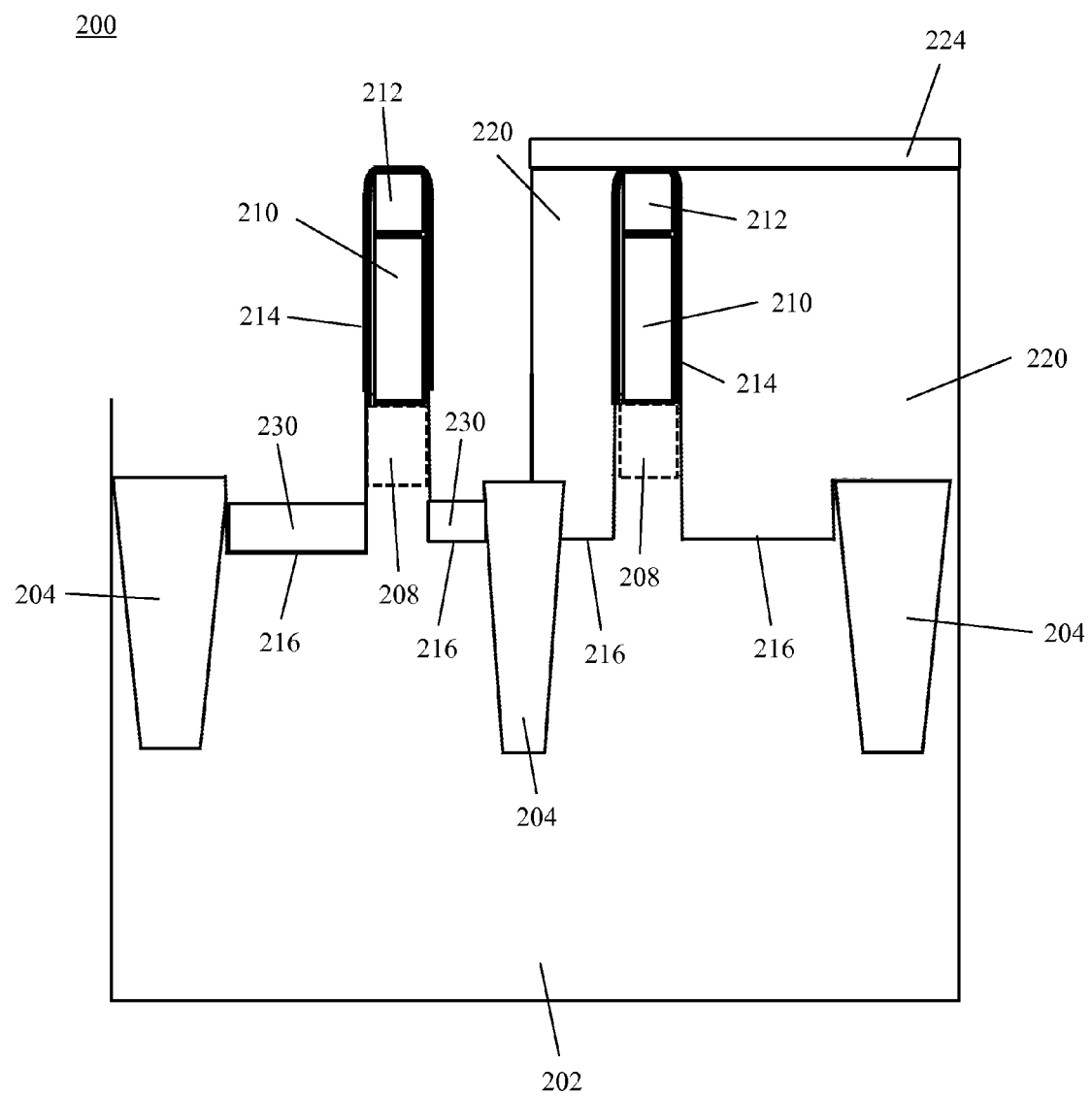
FIG. 9 depicts the intermediate structure of FIG. 8 after a first dry etching of the dielectric layer to expose the at least one sidewall of the fin for an nFET, in accordance with one or more aspects of the present invention.
Figure 10:
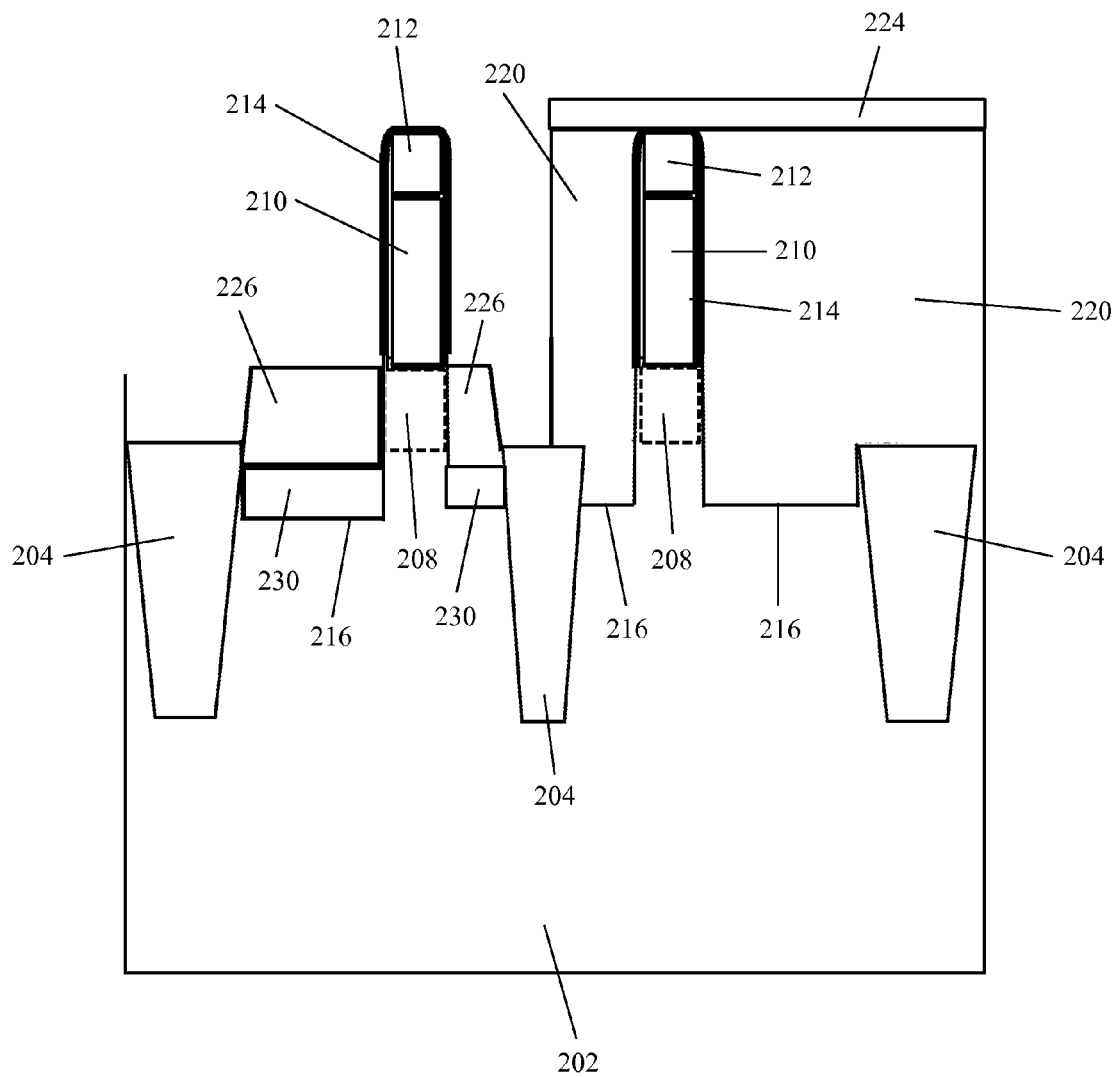
FIG. 10 depicts the intermediate structure of FIG. 9 after formation of the nFET stressor, in accordance with one or more aspects of the present invention.

Alternatively, as shown in FIGS. 8-12, multiple dry etches may be performed in order to enable the nFETs and pFETs to be comprised of different materials. For example, as shown in FIG. 8, a first dry etch may be performed by applying a first hard mask layer 224 over a portion of the dielectric layer 220 and patterning the dielectric layer 220 using the first hard mask layer 224 to expose, for example, one or more nFET areas. The exposed nFET areas may expose the fin sidewalls 218 to a position slightly below the active portion of the fin 206 and a barrier dielectric layer 230 may remain in the at least one nFET recess 216, as shown in FIG. 9. Then SEG may be performed and a first epi layer 226 may be formed on top of the barrier dielectric layer 230 in the bottom of the recess

216. By way of specific example, for an nFET area the epi layer may be, for example, Si:C or any other known nFET epi layer. After the first epi layer 226 is formed, the first hard mask layer 224 may be removed and another dielectric layer 220 may be applied over the device 200 filling the area exposed for forming the first epi layer 226. The dielectric layer 220 may then be planarized.

Figure 11:
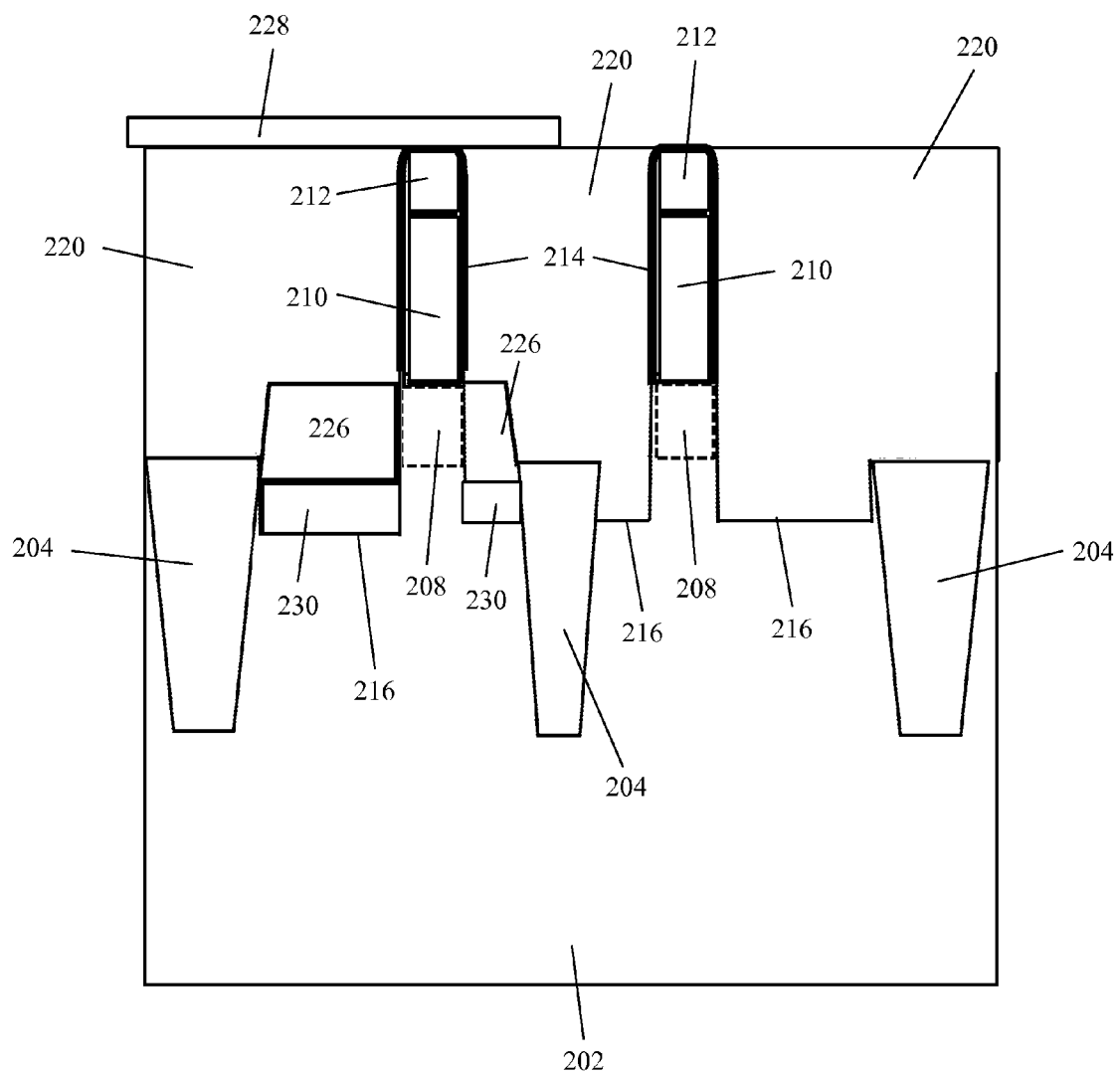
FIG. 11 depicts the intermediate structure of FIG. 10 with a hard mask applied over the nFET area, in accordance with one or more aspects of the present invention.
Figure 12:
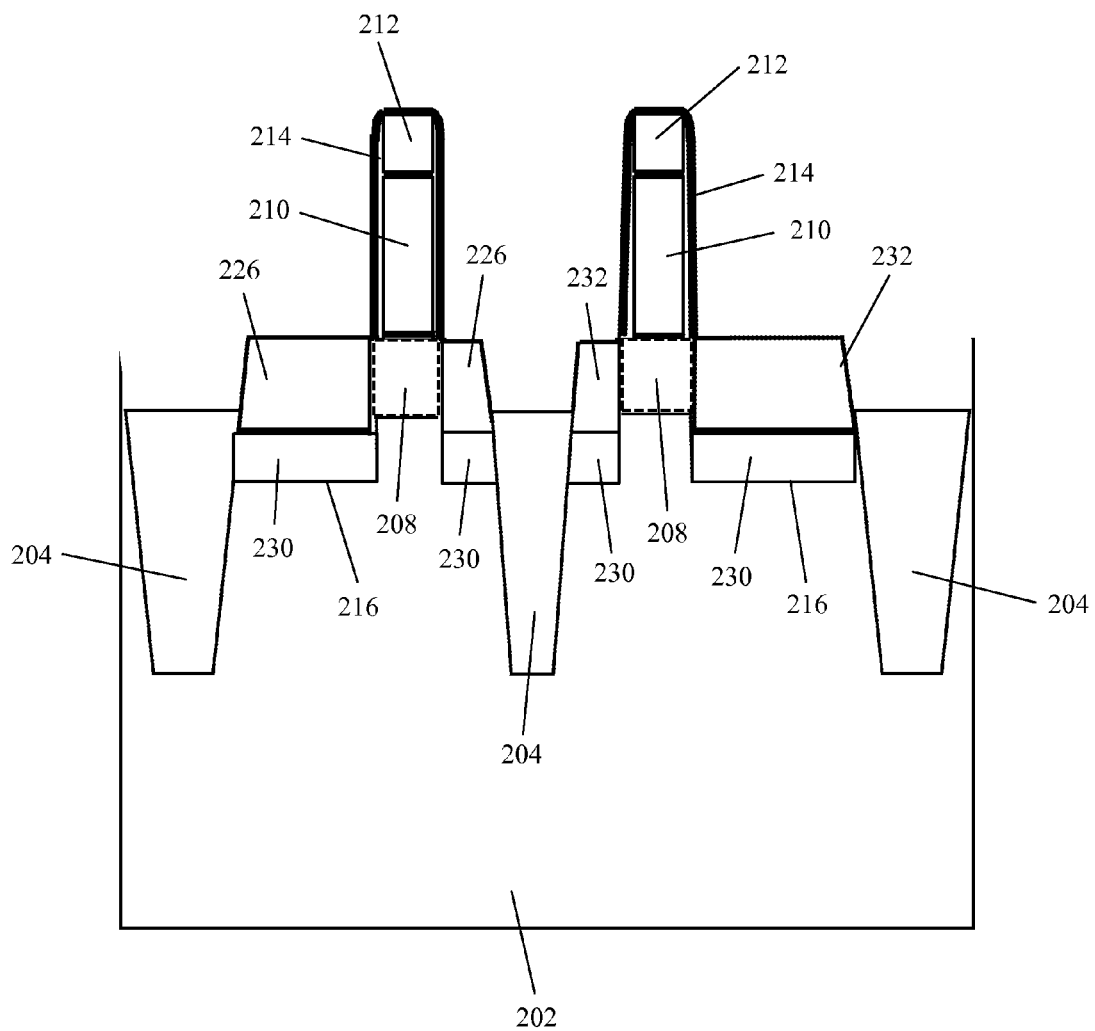
FIG. 12 depicts the intermediate structure of FIG. 11 after a second dry etch of the dielectric layer and formation of a pFET stressor, in accordance with one or more aspects of the present invention.
Figure 13:
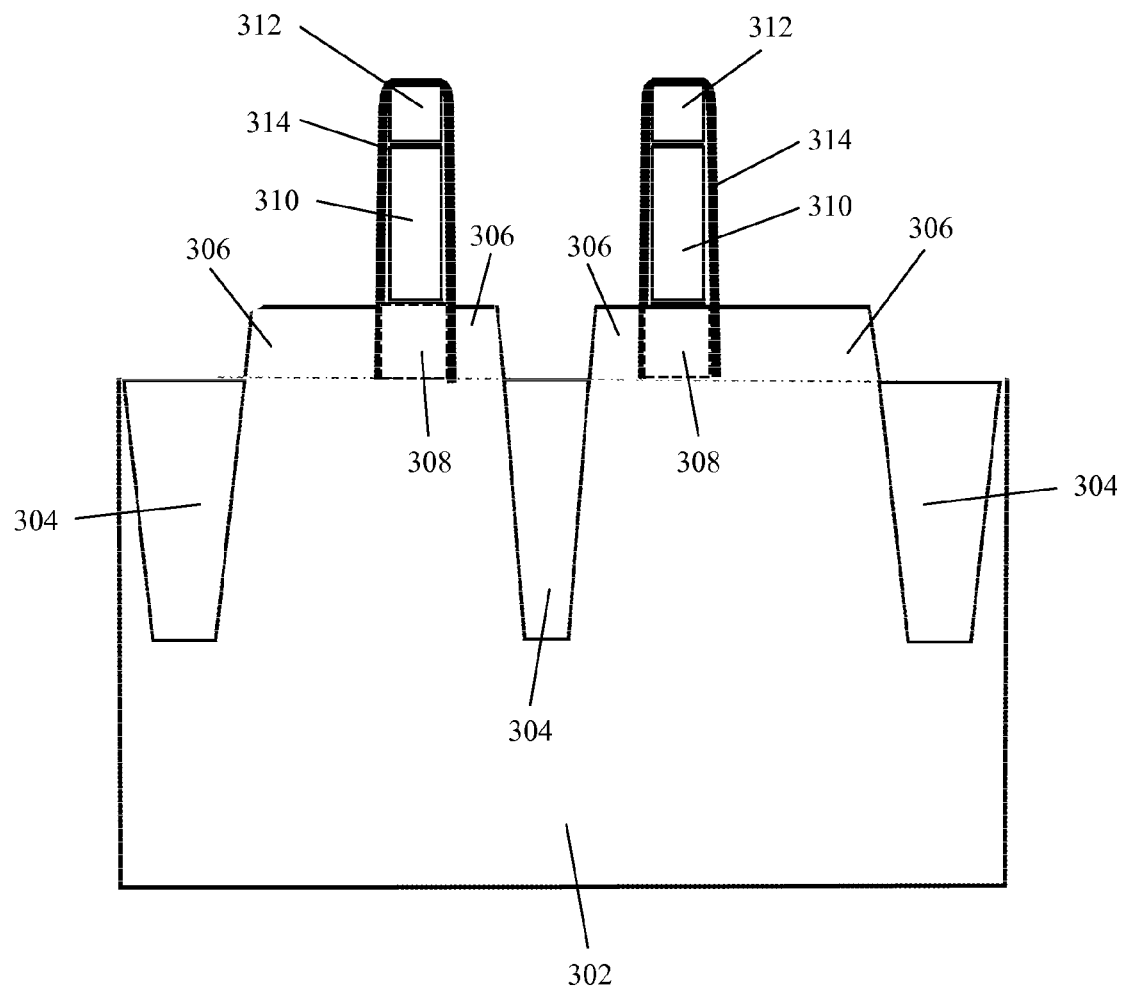
FIG. 13 depicts another embodiment intermediate structure of a semiconductor device with at least one exposed fin, in accordance with one or more aspects of the present invention.

As shown in FIG. 11, a second hard mask layer 228 may then be applied over a portion of the dielectric layer 220 and the second hard mark layer 228 may cover the nFET areas that were created using the first hard mask layer 224. Next, a second dry etch may be performed over the second hard mask layer 228 in order to pattern the dielectric layer 220 to expose, for example, one or more pFET areas. The exposed pFET areas may expose one or more fin sidewalls 218 to a position slightly below the active portion of the fins 206 and a barrier dielectric layer 230 may be left in the bottom of the recesses 216. Then SEG may be performed and a second epi layer 232 may be formed on top of the barrier dielectric layer 230 in the bottom of the pFET recess 216, as shown in FIG. 12. By way of specific example, for a pFET area the epi layer may be, for example, SiGe or any other known pFET epi layer. Once the second epi layer 232 is formed, the second hard mask 228 may be removed from the intermediate structure 200 and the remaining dielectric layer 220 may be removed. In some embodiments the pFET areas may be exposed prior to exposing the nFET areas depending on the design of the device being fabricated. The first epi layer 226 and the second epi layer 232 form the local source and drain on a barrier dielectric layer 230, such as an oxide layer, that is above the base of the fin 206, while still connecting the fin channel region 208 to the base of the fins 206.

After the nFET and pFET areas are formed, the intermediate semiconductor device 200 may proceed to additional fabrication processes, for example, replacement gate formation, silicide and contact formation, back end of line interconnections, and any other processes necessary to complete the semiconductor device design. The resulting semiconductor device will include a FinFET device with the source and drain on local SOI and the channel 208 on bulk resulting in a semiconductor device that may have both low leakage and high performance.

As shown in FIGS. 13-17, another embodiment intermediate semiconductor device 300 may include a substrate 302 which may include, for example, a semiconductor material. The semiconductor material may be of the types described above with reference to substrate 202. The intermediate structure 300 may also include at least one shallow trench isolation (STI) region 304. The intermediate structure 300 may further include at least one exposed fin 306 with at least one channel region 308 in the at least one exposed fin 306. At least one gate 310 may be formed over the at least one channel region 308 and a hard mask region 312 may be applied on top of the at least one gate 310. In addition, the intermediate structure 300 may include at least one spacer 314 applied over the hard mask region 312 and at least one gate 310. As shown in FIGS. 13-17, the device 300 may include three STI regions 304 in the substrate 302, with one STI region 204 placed between the two poly gate structures 310, 312.

Figure 14:
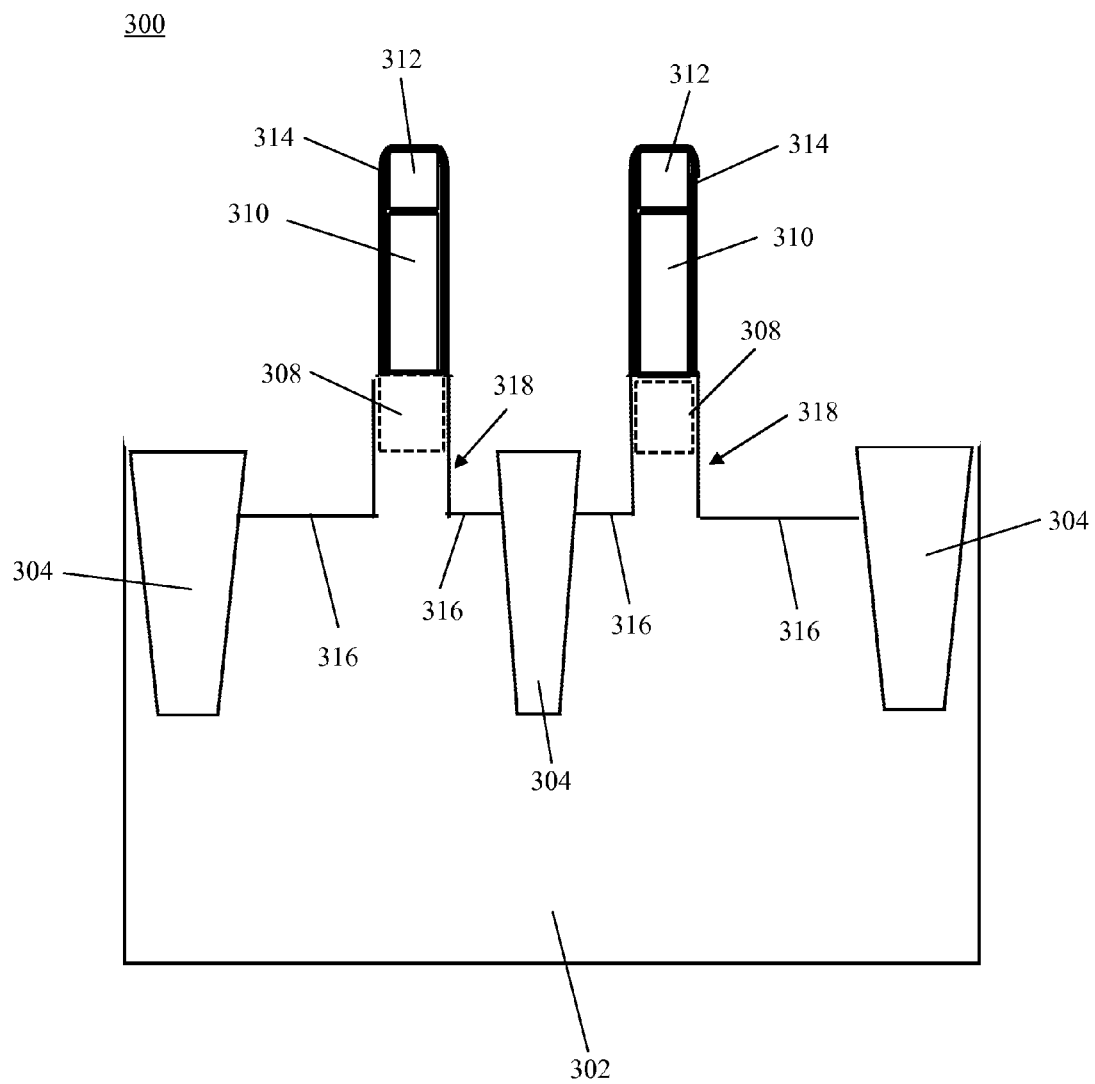
FIG. 14 depicts the intermediate structure of FIG. 13 after creating recesses into the substrate, in accordance with one or more aspects of the present invention.
Figure 15:
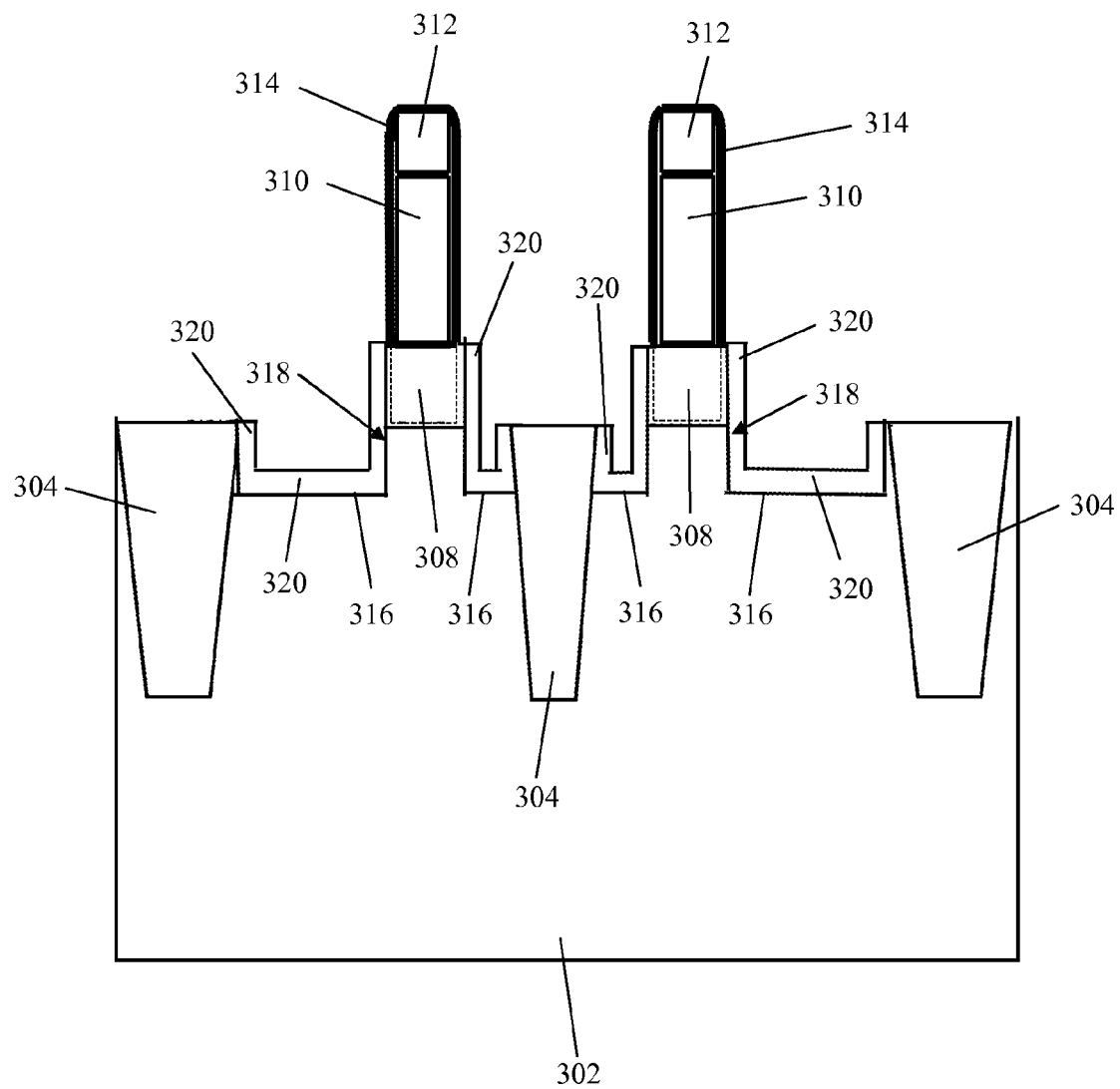
FIG. 15 depicts the intermediate structure of FIG. 14 after application of a dielectric layer, in accordance with one or more aspects of the present invention.
Figure 16:
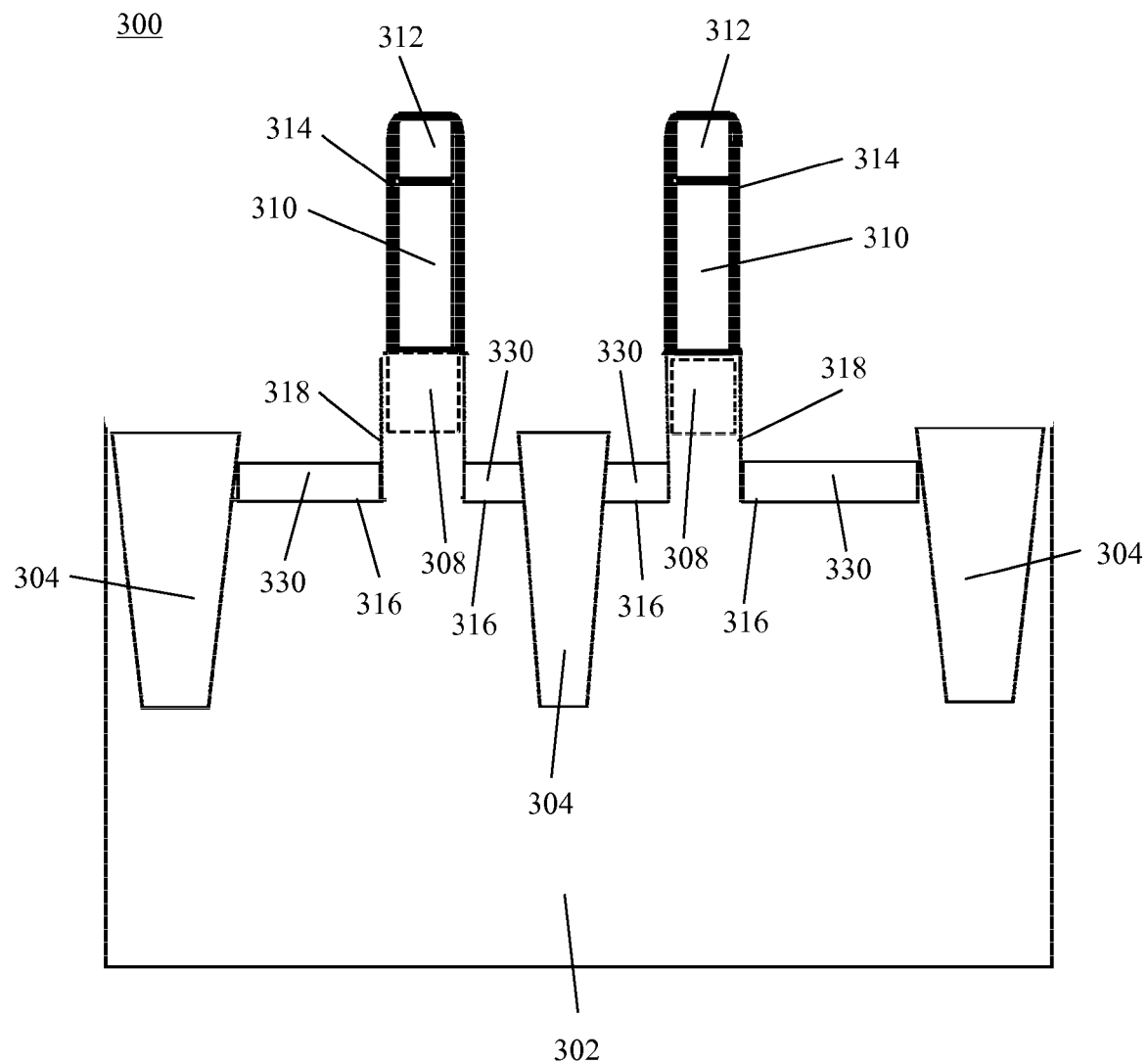
FIG. 16 depicts the intermediate structure of FIG. 15 after at least one sputtering process is performed, in accordance with one or more aspects of the present invention.

As shown in FIG. 14, at least one recess 316 is etched into the substrate 302. The at least one recess 316 may be used for forming the source and drain regions of the structure 300. The at least one recess 316 is formed below the active portion of the fins 306, below the top surface level of the STI region 304, and into the base of the fins 306 by, for example, approximately 5 nm to 200 nm, and more preferably 70 nm to 150 nm. When the recesses 316 are created, the at least one fin sidewall 318 is exposed below the active fin 306. Thus, the need for currently used extension and/or halo implants may be eliminated. A single dry etch or multiple dry etches, as discussed above with reference to the intermediate structure 200, may be performed using one or more masks on the dielectric layer 320 of the intermediate structure 300 to form the recesses 316.

Figure 17:
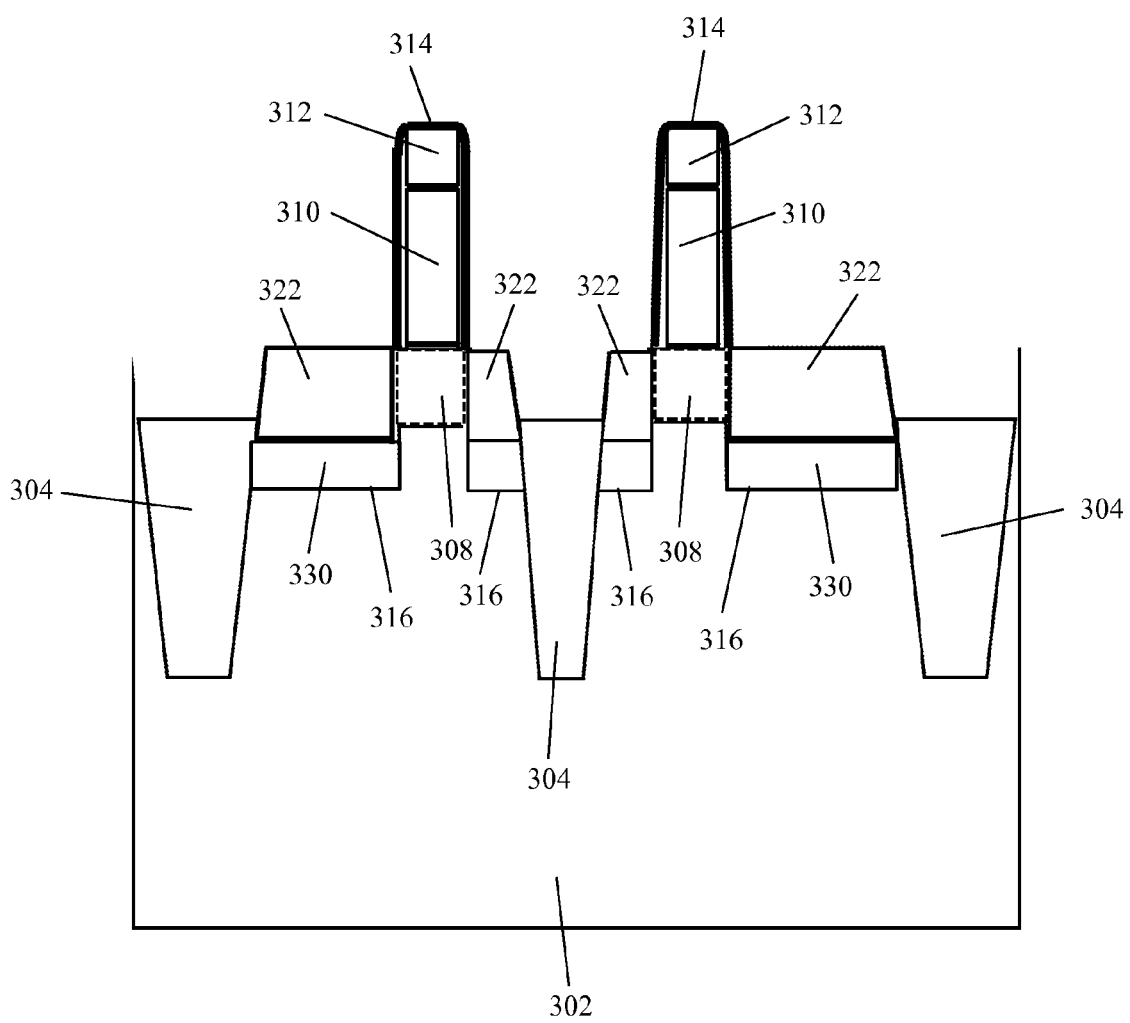
FIG. 17 depicts the intermediate structure of FIG. 16 after application of an epitaxial layer, in accordance with one or more aspects of the present invention.

Next a thin dielectric layer 320 is formed or deposited on the at least one recess 316 and at least one fin sidewall 318. The dielectric layer 320 may be, for example, an oxide layer or other low-k material, such as SiOC, of approximately 1 nm to 10 nm, and more preferably 2 nm to 3 nm. Optionally, an $O_2$ implant with 0°, i.e., vertical implant, may be formed in the substrate 302. After the dielectric layer 320 is applied to the at least one recess 316, a sputtering process may then be performed to remove the dielectric layer 320 from the at least one fin sidewall 318. During the sputtering process some of the dielectric layer 320 may be removed from the at least one fin sidewall 318 and re-deposited on the bottom of the at least one recess 316 forming a barrier dielectric layer 330 in the bottom of the at least one recess 316. The sputtering process may be performed once to create both nFET and pFET regions of the same material. The nFET and pFET regions may be made of the materials described above with reference to intermediate semiconductor device 200. Then SEG may be performed over the barrier dielectric layer 330 forming an epi layer 322 into the source and drain areas laterally, as shown in FIG. 17. By way of specific example, epitaxial layer growth may be, for example, Si, SiGe, Si:C, and the like. Alternatively, when multiple dry etches are performed, multiple sputtering processes may be performed using multiple mask layers to create nFET regions of a first material and pFET regions of a second material. If a sputtering process is performed after each of multiple dry etches, a first SEG would be performed over the barrier dielectric layer 330 of the first set of exposed fins 306 after the first sputtering process to create an epi layer 322 of a first material to form, for example, the nFET regions. Then the first mask layer would be removed and another dielectric layer 320 would be applied to fill in the area exposed to grow the nFET epi layer 322. Next, the dielectric layer 320 may be planarized and a second mask layer would be applied over the dielectric layer 320 of the intermediate device 300. Following application of the second mask layer, a second sputtering process and a second SEG will be performed over the barrier dielectric layer 330 of the second set of exposed fins 306 to create an epi layer 322 of a second material to create, for example, the pFET regions.

After the nFET and pFET areas or regions are formed, the intermediate semiconductor device 300 may be passed to additional fabrication processes, for example, replacement gate formation, silicide and contact formation, back end of line interconnections, and any other processes necessary to complete the semiconductor device design. The resulting semiconductor device will include a FinFET device with the sources and drains on local SOI and the channel 308 on bulk resulting in a semiconductor device that may have both low leakage and high performance.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. A method comprising:
   obtaining an intermediate semiconductor device, comprising:
      a substrate with at least one fin comprising at least one channel;
      at least one gate over the at least one channel;
      at least one hard-mask over the at least one gate; and
      at least one spacer disposed over the at least one gate and at least one hard-mask;
   forming at least one recess into the substrate, wherein the recess comprises a bottom and at least one sidewall exposing a portion of the at least one fin;
   depositing a first dielectric layer into the at least one recess;
   performing chemical mechanical planarization on the first dielectric layer;
   applying a first hard mask layer over the first dielectric layer;
   performing a first dry etch over the first hard mask layer to create a first barrier dielectric layer and expose at least a portion of the at least one sidewalls of the at least one fin;
   depositing a second dielectric layer over the intermediate semiconductor device;
   applying a second hard mask layer over the second dielectric layer;
   performing a second dry etch over the second hard mask layer to create a second barrier dielectric layer and expose at least a portion of the at least one sidewalls of the at least one fin; and
   performing selective epitaxial growth in the at least one recess over the barrier dielectric layer.

2. The method of claim 1, wherein the first dielectric layer is a thick dielectric layer.

3. A method comprising:
   obtaining an intermediate semiconductor device, comprising:
      a substrate with at least one fin comprising at least one channel;
      at least one gate over the at least one channel;
      at least one hard-mask over the at least one gate;
      and at least one spacer disposed over the at least one gate and at least one hard-mask;
   forming at least one recess into the substrate, wherein the recess comprises a bottom and at least one sidewall exposing a portion of the at least one fin;
   depositing a first dielectric layer into the at least one recess, wherein the first dielectric layer is a thick dielectric layer;
   removing at least a portion of the first dielectric layer to form a barrier dielectric layer, comprising:
      performing chemical mechanical planarization on the first dielectric layer; and
      etching the first dielectric layer to expose at least a portion of the at least one sidewalls of the at least one fin, comprising:
         applying a first hard mask layer over the first dielectric layer;
         performing a dry etch over the first hard mask layer to create a first barrier dielectric layer;
         depositing a second dielectric layer over the intermediate semiconductor device;
         applying a second hard mask layer over the first dielectric layer; and
            performing a dry etch over the second hard mask layer to create a second barrier dielectric layer;
   performing selective epitaxial growth in the at least one recess over the barrier dielectric layer.

4. The method of claim 1, wherein the first dielectric layer is a thin dielectric layer.

5. The method of claim 4, further comprising:
   performing sputtering on the thin dielectric layer.

6. The method of claim 4, wherein the thin dielectric layer is approximately 1 nm.

* * * * *